United States Patent
Kwon et al.

(10) Patent No.: US 7,999,396 B2
(45) Date of Patent: Aug. 16, 2011

(54) ADHESIVE TAPE AND SEMICONDUCTOR PACKAGE USING THE SAME

(75) Inventors: Kyeung-do Kwon, Changwon (KR); Sang-yearl Park, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 47 days.

(21) Appl. No.: 12/639,475

(22) Filed: Dec. 16, 2009

(65) Prior Publication Data

US 2010/0187673 A1    Jul. 29, 2010

(30) Foreign Application Priority Data

Jan. 23, 2009    (KR) .................. 10-2009-0006015

(51) Int. Cl.
*H01L 23/48* (2006.01)
*H01L 23/52* (2006.01)

(52) U.S. Cl. ........................................ 257/783; 257/668

(58) Field of Classification Search ................ 257/782, 257/783, 787, 668
See application file for complete search history.

(56) References Cited

U.S. PATENT DOCUMENTS

| 6,455,354 | B1 * | 9/2002 | Jiang .............................. 438/118 |
| 6,541,872 | B1 * | 4/2003 | Schrock et al. ............... 257/783 |
| 2002/0192859 | A1 * | 12/2002 | Akram .......................... 438/106 |
| 2005/0253241 | A1 * | 11/2005 | Hall .............................. 257/686 |
| 2005/0255612 | A1 * | 11/2005 | Jiang et al. ...................... 438/15 |
| 2006/0284319 | A1 * | 12/2006 | Jiang .............................. 257/777 |
| 2007/0194415 | A1 * | 8/2007 | Seng et al. .................... 257/678 |

FOREIGN PATENT DOCUMENTS

| JP | 8-083818 A | 3/1996 |
| KR | 10-2002-0079703 A | 10/2002 |
| KR | 10-0492491 A | 5/2005 |

* cited by examiner

*Primary Examiner* — Sheila V Clark
(74) *Attorney, Agent, or Firm* — Sughrue Mion, PLLC

(57) ABSTRACT

Provided is an adhesive tape which adheres two members to each other and decreases problems that may occur due to contraction and expansion of the adhered members when the temperature of the adhered two members changes. The adhesive tape includes: a base film having insulating properties; and an adhesive agent that adheres on both sides of the base film, wherein a coefficient of thermal expansion of the base film is 10 ppm or lower, a coefficient of thermal expansion of the adhesive tape is lower than 17 ppm, and an occupation rate of the base film in the adhesive tape exceeds 50%.

7 Claims, 4 Drawing Sheets

−65°C

25°C

150°C

ADHESIVE TAPE AND SEMICONDUCTOR PACKAGE USING THE SAME

CROSS-REFERENCE TO RELATED PATENT APPLICATION

This application claims priority from Korean Patent Application No. 10-2009-0006015, filed on Jan. 23, 2009, in the Korean Intellectual Property Office, the disclosure of which is incorporated herein in its entirety by reference.

BACKGROUND OF THE INVENTION

1. Field of the Invention

Apparatuses consistent with the present invention relate to an adhesive tape, and more particularly, to an adhesive tape used in a semiconductor package, and a semiconductor package that uses the adhesive tape.

2. Description of the Related Art

Use of semiconductor packages having detailed and various control functions is remarkably increasing according to the development of the electronic and communication industries. Accordingly, the size of the semiconductor packages is decreasing whereas data processing capacity is increasing, resulting in semiconductor packages that are less expensive and more convenient to use. As such, various research and studies are being performed in order to improve the characteristics of the semiconductor packages.

Despite such research and studies, improvement of the characteristics of the semiconductor packages is still limited, and thus, a semiconductor chip package having a new structure, such as a lead-on-chip semiconductor package, has been developed.

The lead-on-chip semiconductor package has a structure where a semiconductor chip is directly mounted on a lead by using an adhesive tape. By using such a lead-on-chip semiconductor package, the size of the semiconductor chip included in the lead-on-chip semiconductor package may be increased, and a lead frame may be freely designed.

SUMMARY OF THE INVENTION

The present invention provides an adhesive tape that adheres two members to each other and decreases problems that may occur due to contraction/expansion of the two members when the temperature of the adhered two members changes.

The present invention also provides a semiconductor package that uses the adhesive tape.

According to an aspect of the present invention, there is provided an adhesive tape, which adheres two members to each other, the adhesive tape including: a base film having insulating properties; and an adhesive agent that adheres on both sides of the base film, wherein a coefficient of thermal expansion of the base film is 10 ppm or lower, a coefficient of thermal expansion of the adhesive tape is lower than 17 ppm, and an occupation rate of the base film in the adhesive tape exceeds 50%.

According to another aspect of the present invention, there is provided a semiconductor package including: a semiconductor chip that controls operations of a certain apparatus; a plurality of leads electrically connecting the semiconductor chip and the certain apparatus; a plurality of bonding wires electrically connecting the plurality of leads and the semiconductor chip; adhesive tapes mutually adhering the plurality of leads and the semiconductor chip; and a molding resin entirely sealing the semiconductor chip and the plurality of bonding wires, and the adhesive tapes and partially sealing the plurality of leads, wherein each of the adhesive tapes includes a base film having insulating properties and an adhesive agent adhered to both sides of the base film, a coefficient of thermal expansion each of the adhesive tapes is lower than 17 ppm, and an occupation rate of the base film in the adhesive tape exceeds 50%.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
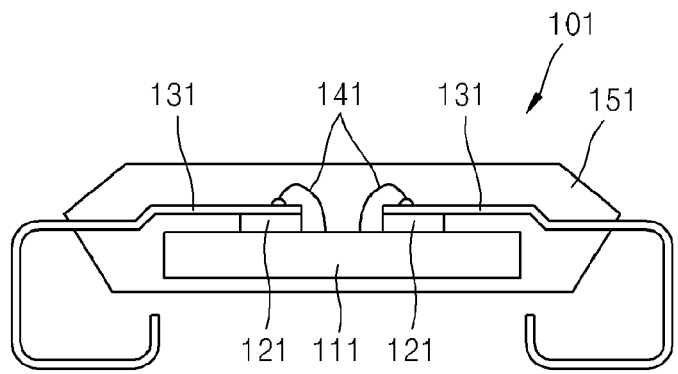
FIG. 1 is a lateral cross-sectional view illustrating a semiconductor package, according to an embodiment of the present invention.

Hereinafter, the present invention will be described more fully with reference to the accompanying drawings, in which exemplary embodiments of the invention are shown. In the drawings, like reference numerals denote like elements.

Figure 2:
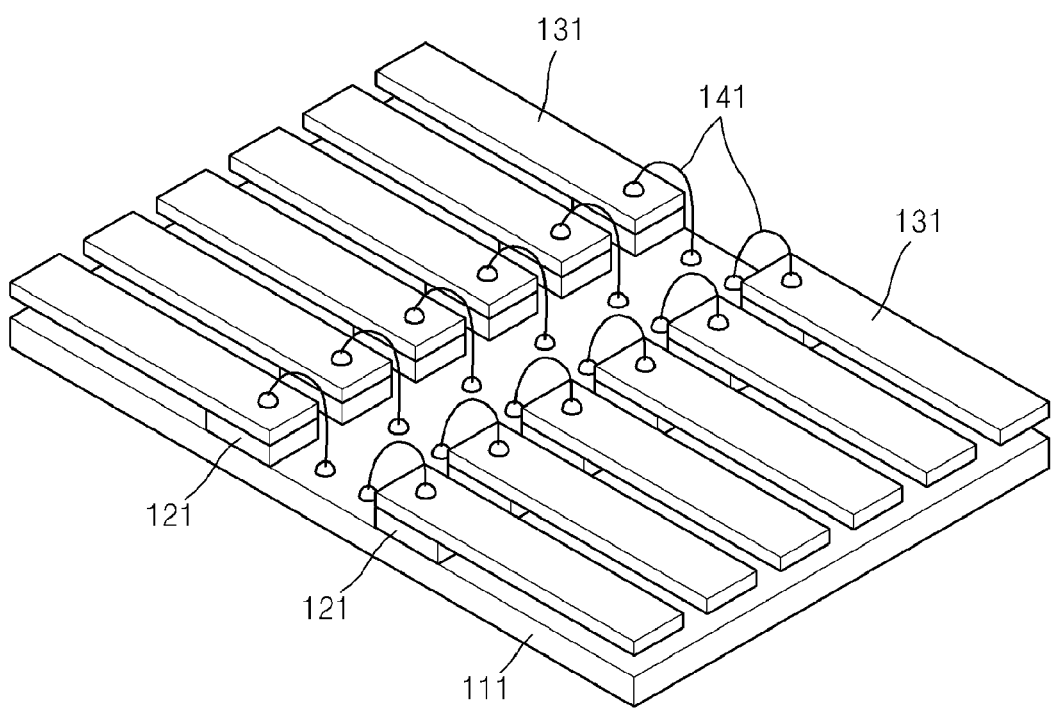
FIG. 2 is a perspective view partially illustrating a semiconductor chip, a plurality of adhesive tapes, and a plurality of leads illustrated in FIG. 1.

FIG. 1 is a lateral cross-sectional view illustrating a semiconductor package 101, according to an exemplary embodiment. FIG. 2 is a perspective view partially illustrating a semiconductor chip 111, a plurality of adhesive tapes 121, and a plurality of leads 131 illustrated in FIG. 1. Referring to FIGS. 1 and 2, the semiconductor package 101 includes the semiconductor chip 111 that controls operations of an external apparatus, the plurality of leads 131 electrically connecting the semiconductor chip 111 and the external apparatus, a plurality of bonding wires 141 electrically connecting the plurality of leads 131 and the semiconductor chip 111, the plurality of adhesive tapes 121 mutually adhering the plurality of leads 131 and the semiconductor chip 111 to each other, and a molding resin 151 entirely sealing the semiconductor chip 111 and the plurality of bonding wires 141 and the plurality of adhesive tapes 121 and partially sealing the plurality of leads 131.

As illustrated in FIG. 1, the semiconductor package 101 that has a structure where the leads 131 are attached on the semiconductor chip 111 is called a lead-on-chip (LOC) semiconductor package, and the adhesive tapes 121 may be used in such a LOC semiconductor package 101.

When the number of leads 131 is small, the number of adhesive tapes 121 may be one.

Figure 3:
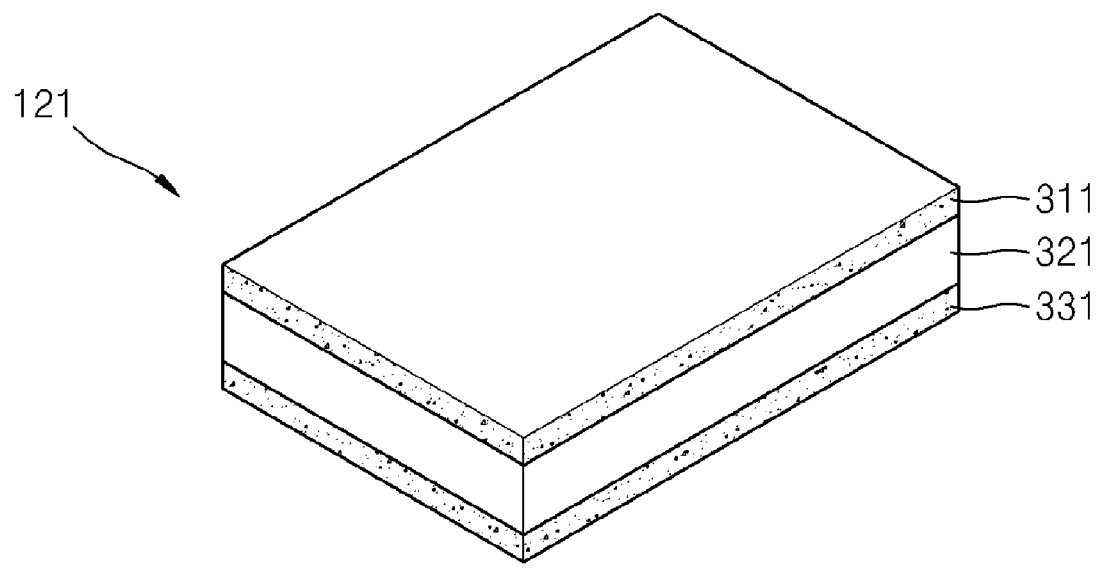
FIG. 3 is a perspective view illustrating one of the plurality of adhesive tapes illustrated in FIG. 1.

FIG. 3 is a perspective view illustrating one of the adhesive tapes 121 illustrated in FIG. 1. Referring to FIG. 3, the adhesive tape 121 includes a base film 321 and adhesive agents 311 and 331 adhered on both sides of the base film 321. The base film 321 may be formed of a polyimide film that is an insulating material.

A coefficient of thermal expansion of the adhesive tape 121 is set to be similar to coefficients of thermal expansion of the semiconductor chip 111 and the lead 131 of FIG. 1. For example, when the coefficients of thermal expansion of the semiconductor chip 111 and the lead 131 are respectively 3 ppm and 5 ppm, the coefficient of thermal expansion of the adhesive tape 121 is set to be lower than 17 ppm. All objects having a low coefficient of thermal expansion have a low displacement according to temperature. Accordingly, the coefficients of thermal expansion of the semiconductor chip 111, the lead 131, and the adhesive tape 121 may be set to be lower than 17 ppm. Specifically, even when the adhesive tape 121 has the same coefficient of thermal expansion as the semiconductor chip 111 and the lead 131, the displacement of the adhesive tape 121 is much bigger than that of the semiconductor chip 111 and the lead 131, and thus the coefficient of thermal expansion of the adhesive tape 121 may be set to be lower than 17 ppm.

In order to decrease the coefficient of thermal expansion of the adhesive tape 121, the coefficient of thermal expansion of the base film 321 needs to be decreased, and an occupation rate of the base film 321 on the adhesive tape 121 needs to be increased. The occupation rate of the base film 321 is a rate of the base film 321 occupying the adhesive tape 121. Accordingly, when the coefficient of thermal expansion and a modulus of the base film 321 are respectively in a range of 1 to 5 ppm and in a range of 3 to 9 Gpa, and the coefficients of thermal expansion and moduli of the adhesive agents 311 and 331 are respectively in a range of 20 to 100 ppm and in a range of 0.5 to 4 GPa, the occupation rate of the base film 321 may exceed 50%.

When the coefficient of thermal expansion and the modulus of the base film 321 are respectively in a range of 3 to 4 ppm and in a range of 3 to 5 GPa, and the coefficients of thermal expansion and the moduli of the adhesive agents 311 and 331 are respectively in a range of 20 to 100 ppm and in a range of 0.5 to 4 GPa, the occupation rate of the base film 321 may exceed 60%.

As described above, the base film 321 having the coefficient of thermal expansion of 10 ppm or lower may be used.

The adhesive tape 121 is prepared by coating and hardening the adhesive agent 311 on one side of the base film 321, and then coating and hardening the adhesive agent 331, which is the same type as the adhesive agent 311, on the other side of the base film 321. The adhesive tape 121 may be stored by being rolled around a roller (not shown). In order to use the adhesive tape 121 rolled around the roller, the roller is rolled to loosen the adhesive tape 121, and the adhesive tape 121 is cut according to the sizes of the semiconductor chip 111 and the lead 131.

In order to adhere the semiconductor chip 111 and the lead 131 using the adhesive tape 121, the adhesive tape 121 is disposed between the semiconductor chip 111 and the lead 131, and then a high temperature, such as heat in a range of 150 to 400° C., is applied to the adhesive tape 121. Then, the adhesive agents 311 and 331 are melted on both sides of the base film 321. Here, the lead 131 and the semiconductor chip 111 are pressed and hardened by a pressurizing means, thereby mutually adhering the semiconductor chip 111 and the lead 131 using the adhesive tape 121.

In order to prepare the semiconductor package 101, the adhesive tape 121 is first attached to the lead 131 and then the semiconductor chip 111 is attached to the adhesive tape 121, or the adhesive tape 121 is first attached to the semiconductor chip 111 and then the lead 131 is attached to the adhesive tape 121.

Two (2) adhesive interfaces are formed between the semiconductor chip 111, the adhesive tape 121, and the lead 131. When differences between the coefficients of thermal expansion of the semiconductor chip 111, the adhesive tape 121, and the lead 131 are big, the two (2) adhesive interfaces may be detached from each other or cracked. Accordingly, in order to prevent the adhesive interfaces from being detached or cracked, the adhesive tape 121 has a similar coefficient of thermal expansion as the coefficients of thermal expansion of the semiconductor chip 111 and the lead 131.

Figure 4A:
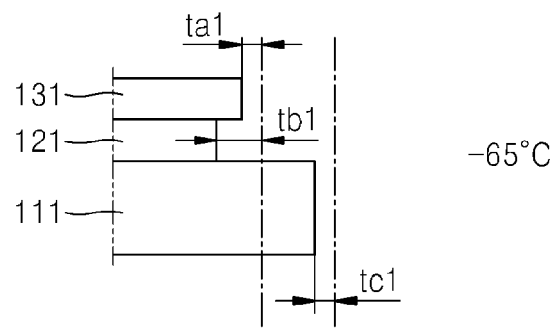
FIGS. 4A through 4C are diagrams illustrating states when the semiconductor chip, the adhesive tape, and the lead illustrated in FIG. 2 contract and expand according to temperature.
Figure 4B:
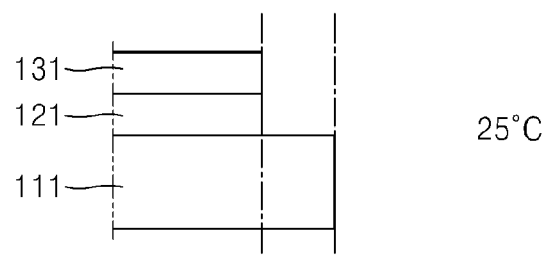
Figure 4C:
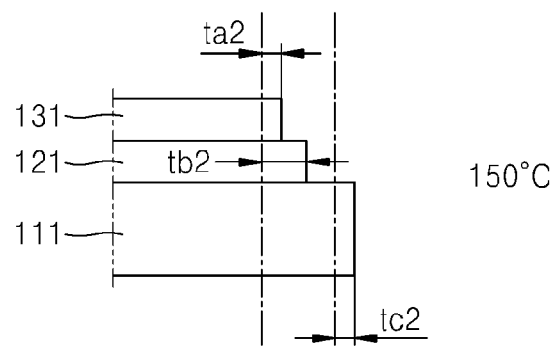

FIG. 4A through 4C are diagrams illustrating states when the semiconductor chip 111, the adhesive tape 121, and the lead 131 illustrated in FIG. 2 contract and expand according to temperature. In detail, FIG. 4B shows the semiconductor chip 111, the adhesive tape 121, and the lead 131 in room temperature, FIG. 4A shows the semiconductor chip 111, the adhesive tape 121, and the lead 131 contracted at a low temperature, and FIG. 4C shows the semiconductor chip 111, the adhesive tape 121, and the lead 131 expanded at a high temperature.

FIG. 4A and FIG. 4C are a phenomenon occurring during a reliability test of the semiconductor package 101 of FIG. 1. In other words, in order to test the reliability of the semiconductor package 101, the functions of the semiconductor package 101 are tested by changing the temperature of the semiconductor package 101 from a low temperature to a high temperature, for example, from −65° C. to 150° C. Here, the semiconductor chip 111, the adhesive tape 121, and the lead 131 respectively contract to first sizes ta1, tb1, and tc1 at the low temperature, and respectively expand to second sizes ta2, tb2, and tc2 at the high temperature. At this time, the adhesive tape 121 contracts and expands more than the semiconductor chip 111 and the lead 131.

However, since the coefficient of thermal expansion of the adhesive tape 121 is similar to the coefficients of thermal expansion of the semiconductor chip 111 and the lead 131, the semiconductor chip 111 and the lead 131 contract and expand in a similar size while testing the semiconductor package 101 for reliability. Accordingly, the adhesive interfaces between the semiconductor chip 111 and the lead 131 are not detached or do not crack.

Table 1 below shows displacement of the semiconductor chip 111, the adhesive tape 121, and the lead 131 according to temperature.

TABLE 1

|  |  | Semiconductor Chip | Nickel Lead | Copper Lead | Conventional Adhesive Tape | Adhesive Tape of Present Invention |
|---|---|---|---|---|---|---|
| Coefficient of Thermal Expansion |  | 3 | 5 | 15 | 25 | 5 |
| Displacement (um) | −65° C. | −1.8 | 0.0 | −0.1 | −15.4 | −3.1 |
|  | 23° C. | 0 | 0 | 0 | 0 | 0 |
|  | 150° C. | 2.7 | 0.1 | 0.2 | 22.2 | 4.4 |
| Displacement Width (um) |  | 4.5 | 0.1 | 0.3 | 37.6 | 7.5 |

As shown in Table 1, the displacement according to temperature decreases as the coefficients of thermal expansion of the semiconductor chip 111, the adhesive tape 121, and the lead 131 are decreased. Here, the lengths of the semiconductor chip 111 and the adhesive tape 121 are 7 mm, and the width of the lead 131 is 0.1 mm.

The coefficient of thermal expansion of the adhesive tape 121 is determined based on the thicknesses, coefficients of thermal expansion, and moduli of the base film 321 and the adhesive agents 311 and 331.

Figure 5:
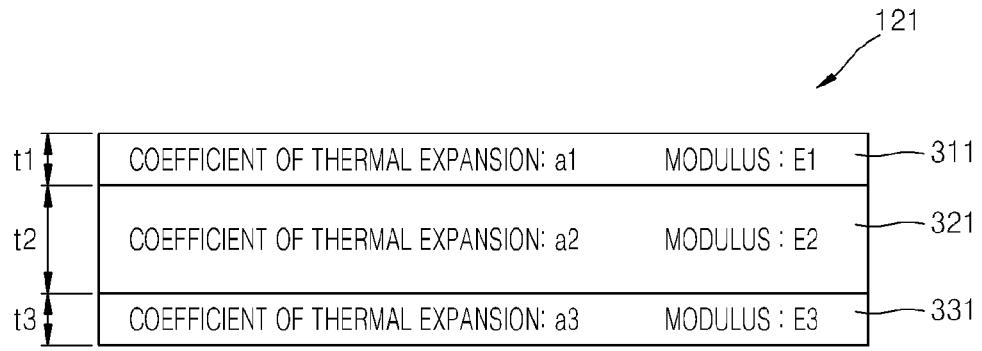
FIG. 5 is a diagram for calculating a coefficient of thermal expansion of the adhesive tape of FIGS. 3.

FIG. 5 is a diagram for calculating a coefficient of thermal expansion of the adhesive tape 121 of FIG. 3. Referring to FIG. 5, a thickness, a coefficient of thermal expansion, and a modulus of the adhesive agent 311 formed on the top surface of the base film 321 are respectively referred to as $t1$, $a1$, and $E1$, a thickness, a coefficient of thermal expansion, and a modulus of the base film 321 are respectively referred to as $t2$, $a2$, and $E2$, and a thickness, a coefficient of thermal expansion, and a modulus of the adhesive agent 331 formed on the bottom surface of the base film 321 are respectively referred to as $t3$, $a3$, and $E3$. Here, an equivalent coefficient of thermal expansion (CTEt) and an equivalent modulus Mt of the adhesive tape 121 are respectively calculated as Equations 1 and 2 below.

$$CTEt = \frac{t1 \times E1 \times a1 + t2 \times E2 \times a2 + t3 \times E3 \times a3}{t1 \times E1 + t2 \times E2 + t3 \times E3} \quad (1)$$

$$Mt = \frac{t1 \times E1 + t2 \times E2 + t3 \times E3}{t1 + t2 + t3} \quad (2)$$

Figure 6:
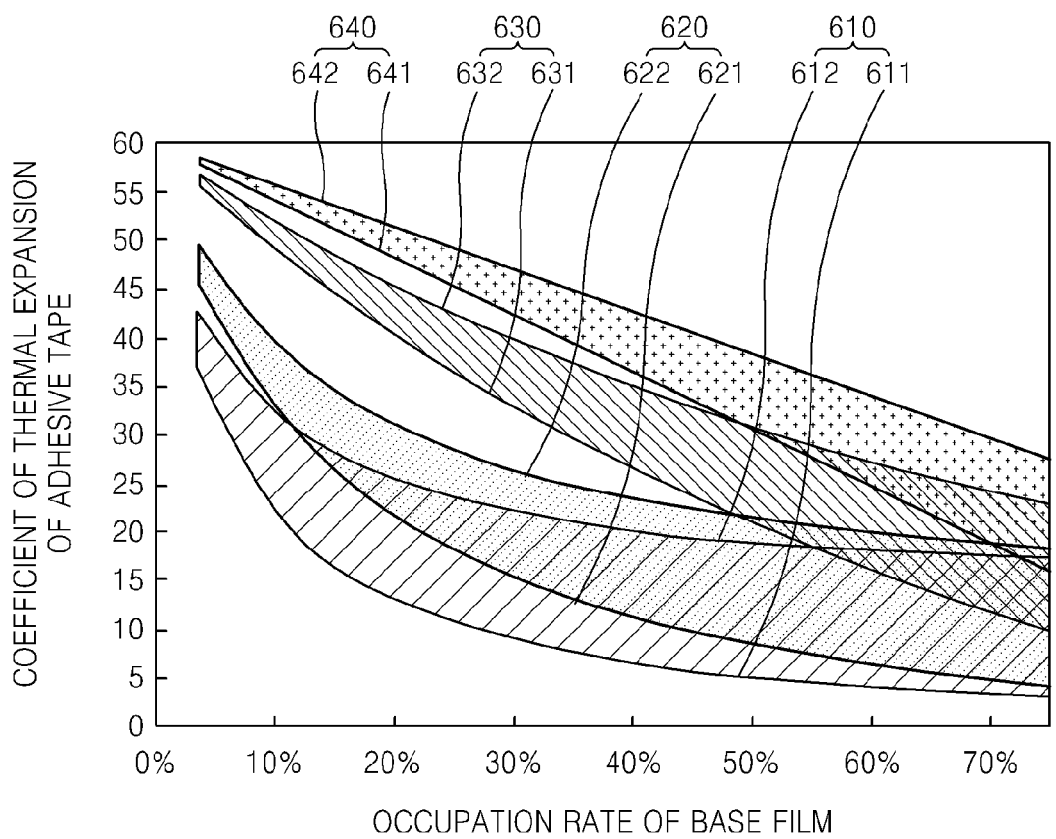
FIG. 6 is a graph showing a thermal expansion coefficient of the adhesive tape of FIG. 2 according to a thermal expansion coefficient, modulus, and thickness of a base film illustrated in FIG. 3.

FIG. 6 is a graph showing a thermal expansion coefficient of the adhesive tape 121 of FIG. 3 according to a thermal expansion coefficient, modulus, and thickness of the base film 321 illustrated in FIG. 2.

In curve 640, the moduli of the base film 321 of FIG. 5 and the adhesive tapes 311 and 331 are 4 GPa, and a coefficient of thermal expansion of the base film 321 is in a range of 1 to 16 ppm. Since the modulus of the base film 321 is small and the moduli of the adhesive agents 311 and 331 are big, a coefficient of thermal expansion of the adhesive tape 121 of FIG. 5 is high. Also, a coefficient of thermal expansion of the adhesive tape 121 is lower when the coefficient of thermal expansion of the base film 321 is 1 ppm at a point 641 than that of the adhesive tape 121 when the coefficient of thermal expansion of the base film 321 is 16 ppm at a point 642.

In curve 630, the moduli of the base film 321 and the adhesive agents 311 and 331 are respectively 8 GPa and 4 GPa, and a coefficient of thermal expansion of the base film 321 is in a range of 1 to 16 ppm. As the modulus of the base film 321 increases, a coefficient of thermal expansion of the adhesive tape 121 decreases. Also, a coefficient of thermal expansion of the adhesive tape 121 is lower when the coefficient of thermal expansion of the base film 321 is 1 ppm at a point 631 than that of the adhesive tape 121 when the coefficient of thermal expansion of the base film 321 is 16 ppm at a point 632.

In curve 620, the moduli of the base film 321 and the adhesive agents 311 and 331 are respectively 4 GPa and 0.5 GPa, and a coefficient of thermal expansion of the base film 321 is in a range of 1 to 16 ppm. As the moduli of the adhesive agents 311 and 331 decrease, a coefficient of thermal expansion of the adhesive tape 121 decreases. Also, a coefficient of thermal expansion of the adhesive tape 121 is lower when the coefficient of thermal expansion of the base film 321 is 1 ppm at a point 621 than that of the adhesive tape 121 when the coefficient of thermal expansion of the base film 321 is 16 ppm at a point 622.

In curve 610, the moduli of the base film 321 and the adhesive agents 311 and 331 are respectively 8 GPa and 0.5 GPa, and a coefficient of thermal expansion of the base film 321 is in a range of 1 to 16 ppm. Since the modulus of the base film 321 is big and the moduli of the adhesive agents 311 and 331 are small, a coefficient of thermal expansion of the adhesive tape 121 of FIG. 5 is very low. Also, a coefficient of thermal expansion of the adhesive tape 121 is lower when the coefficient of thermal expansion of the base film 321 is 1 ppm at a point 611 than that of the adhesive tape 121 when the coefficient of thermal expansion of the base film 321 is 16 ppm at a point 612.

Referring to FIG. 6, an occupation rate of the base film 321 is in inverse proportion to the coefficient of thermal expansion of the adhesive tape 121. In other words, when the occupation rate of the base film 321 increases, the coefficient of thermal expansion of the adhesive tape 121 decreases, and inversely, when the occupation rate of the base film 321 decreases, the coefficient of thermal expansion of the adhesive tape 121 increases.

Also, when the coefficient of thermal expansion of the adhesive tape 121 is equal to or lower than 17 ppm, and the occupation rate of the base film 321 exceeds 50%, the coefficient of thermal expansion of the adhesive tape 121 slowly decreases.

As shown in Table 1, the coefficients of thermal expansion of the semiconductor chip 111 and the lead 131 are equal to or lower than 10 ppm, and thus, the coefficient of thermal expansion of the adhesive tape 121 may be set to be equal to or lower than 17 ppm.

Accordingly, in order to set the coefficient of thermal expansion of the adhesive tape 121 equal to or lower than 17 ppm, the occupation rate of the base film 321 may be set to exceed 50%, when the coefficient of thermal expansion and the modulus of the base film 321 are respectively in a range of 1 to 5 ppm and in a range of 7 to 9 GPa, and the coefficients of thermal expansion and the moduli of the adhesive agents 311 and 331 are respectively in a range of 20 to 100 ppm and in a range of 0.5 to 4 GPa.

Alternatively, in order to set the coefficient of thermal expansion of the adhesive tape 121 equal to or lower than 17 ppm, the occupation rate of the base film 321 may be set to exceed 60%, when the coefficient of thermal expansion and the modulus of the base film 321 are respectively in a range of 3 to 5 ppm and in a range of 3 to 5 GPa, and the coefficients of thermal expansion and the moduli of the adhesive agents 311 and 331 are respectively in a range of 20 to 100 ppm and in a range of 0.5 to 4 GPa.

According to the present invention, when a semiconductor chip is adhered on a lead by using an adhesive tape, the differences between coefficients of thermal expansion of the semiconductor chip and the adhesive tape, and between coefficients of thermal expansion of the lead and the adhesive tape are decreased since the coefficient of thermal expansion of the adhesive tape is low.

Accordingly, even when the temperature of a semiconductor package remarkably changes, an interface between the adhesive tape and the semiconductor chip is prevented from being detached or cracked, and a bonding wire bonded to the lead is prevented from detaching from the lead.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An adhesive tape, which adheres two members to each other, the adhesive tape comprising:
   a base film having insulating properties; and
   an adhesive agent that adheres on both sides of the base film,
   wherein a coefficient of thermal expansion of the base film is 10 ppm or lower, a coefficient of thermal expansion of the adhesive tape is lower than 17 ppm, and an occupation rate of the base film in the adhesive tape exceeds 50%.

2. The adhesive tape of claim 1, wherein the base film is a polyimide film.

3. The adhesive tape of claim 1, wherein the two members are a semiconductor chip and a lead of a semiconductor package including the semiconductor chip, respectively.

4. The adhesive tape of claim 1, wherein the coefficient of thermal expansion and a modulus of the base film are respectively in a range of 1 to 5 ppm and in a range of 7 to 9 GPa, and a coefficient of thermal expansion and a modulus of the adhesive agent are respectively in a range of 20 to 100 ppm and in a range of 0.5 to 4 GPa.

5. The adhesive tape of claim 1, wherein the coefficient of thermal expansion and a modulus of the base film are respectively in a range of 3 to 5 ppm and in a range of 3 to 5 GPa, a coefficient of thermal expansion and a modulus of the adhesive agent are respectively in a range of 20 to 100 ppm and in a range of 0.5 to 4 GPa, and an occupation rate of the base film in the adhesive tape exceeds 60%.

6. A semiconductor package comprising:
   a semiconductor chip that controls operations of an apparatus;
   a plurality of leads that electrically connect the semiconductor chip and the apparatus;
   a plurality of bonding wires that electrically connect the plurality of leads and the semiconductor chip;
   adhesive tapes that mutually adhere the plurality of leads and the semiconductor chip; and
   a molding resin that entirely seals the semiconductor chip and the plurality of bonding wires, and the adhesive tapes, and partially seals the plurality of leads,
   wherein each of the adhesive tapes comprises a base film having insulating properties and an adhesive agent adhered to both sides of the base film, a coefficient of thermal expansion each of the adhesive tapes is lower than 17 ppm, and an occupation rate of the base film in the adhesive tape exceeds 50%.

7. The semiconductor package of claim 6, wherein coefficients of thermal expansion of the semiconductor chip and the plurality of leads are equal to or lower than 10 ppm.

* * * * *